United States Patent
Cheng et al.

(10) Patent No.: US 11,693,187 B2
(45) Date of Patent: Jul. 4, 2023

(54) MULTI-AXIS MEMS MIRROR PARKING

(71) Applicant: Google LLC, Mountain View, CA (US)

(72) Inventors: Hsing Cheng, San Jose, CA (US); Kevin Yasumura, Lafayette, CA (US)

(73) Assignee: Google LLC, Mountain View, CA (US)

( * ) Notice: Subject to any disclaimer, the term of this patent is extended or adjusted under 35 U.S.C. 154(b) by 173 days.

(21) Appl. No.: 17/108,229

(22) Filed: Dec. 1, 2020

(65) Prior Publication Data

US 2021/0255399 A1 Aug. 19, 2021

Related U.S. Application Data

(60) Provisional application No. 62/976,826, filed on Feb. 14, 2020.

(51) Int. Cl.
G02B 6/35 (2006.01)
B81B 3/00 (2006.01)
H04B 10/69 (2013.01)

(52) U.S. Cl.
CPC .......... G02B 6/3518 (2013.01); B81B 3/0062 (2013.01); G02B 6/3556 (2013.01);
(Continued)

(58) Field of Classification Search
CPC .. G02B 6/3518; G02B 6/3556; G02B 6/3584; G02B 6/3586; G02B 6/3588;
(Continued)

(56) References Cited

U.S. PATENT DOCUMENTS 5,771,116 A 6/1998 Miller et al.
6,587,611 B1 * 7/2003 Hunt ................. H04Q 11/0005
385/20
(Continued)

FOREIGN PATENT DOCUMENTS

CN 101013196 A 8/2007
CN 101101358 A 1/2008
(Continued)

OTHER PUBLICATIONS

Braden Smith, et al., Single chip lidar with discrete beam steering by digital micromirror device, Optics Express 14732, vol. 25, No. 13, Jun. 26, 2017, 14 pages.
(Continued)

*Primary Examiner* — Daniel Petkovsek
(74) *Attorney, Agent, or Firm* — Lerner David LLP

(57) ABSTRACT

The present disclosure provides an improved method of parking a microelectromechanical system (MEMS) mirror in an array of MEMS mirrors to protect against single high voltage channel failures in a driver. Two separate voltages are applied to each MEMS mirror to move and park the mirror out of a camera sensor field of view in a servo system. For example, a first voltage may be applied in a positive X direction and a second voltage may be applied in a positive Y direction which will move the mirror in a diagonal direction. If one of the high voltage channels fail, the mirror will still be parked and outside of the camera sensor field of view. If a high voltage channel fails, the servo system can park a mirror affected by the failure in an opposite corner. Moreover, if 2-axis parking is not feasible, the mirror can use single-voltage parking.

20 Claims, 12 Drawing Sheets

(52) U.S. Cl.
CPC ......... *G02B 6/3584* (2013.01); *G02B 6/3586* (2013.01); *G02B 6/3588* (2013.01); *H04B 10/69* (2013.01); *B81B 2201/042* (2013.01)

(58) Field of Classification Search
CPC .............. G02B 26/0841; B81B 3/0062; B81B 2201/042; H04B 10/69
See application file for complete search history.

(56) References Cited

U.S. PATENT DOCUMENTS

| | | | |
|---|---|---|---|
| 6,625,341 | B1 | 9/2003 | Novotny |
| 6,728,016 | B1* | 4/2004 | Hunt .................... G02B 6/3586 359/223.1 |
| 2004/0071393 | A1* | 4/2004 | Staker .................... G02B 6/356 385/18 |
| 2006/0140536 | A1* | 6/2006 | Aota .................. G02B 6/29313 385/24 |
| 2008/0050064 | A1 | 2/2008 | Sakai et al. |
| 2008/0239443 | A1* | 10/2008 | Korevaar ............... G02B 6/359 359/223.1 |
| 2016/0154183 | A1* | 6/2016 | Zhou .................... G02B 6/3546 385/17 |
| 2018/0364419 | A1 | 12/2018 | Yasumura et al. |

FOREIGN PATENT DOCUMENTS

| | | |
|---|---|---|
| CN | 106537200 A | 3/2017 |
| CN | 106796328 A | 5/2017 |
| CN | 109143605 A | 1/2019 |
| CN | 110612465 A | 12/2019 |
| WO | 2018231308 A1 | 12/2018 |

OTHER PUBLICATIONS

Nathan Farrington, et. al., Helios: A Hybrid Electrical/Optical Sweitch Architecture for Modular Data Centers, SIGCOMM'10, Aug. 30-Sep. 3, 2010, New Delhi, India., 12 pages.
Extended European Search Report for European Patent Application No. 20212477.2 dated May 11, 2021. 9 pages.
First Office Action for Chinese Patent Application No. 202011453027.8 dated Jun. 6, 2022. 7 pages.
Office Action for Taiwanese Patent Application No. 109144054 dated May 15, 2023. 10 pages.

* cited by examiner

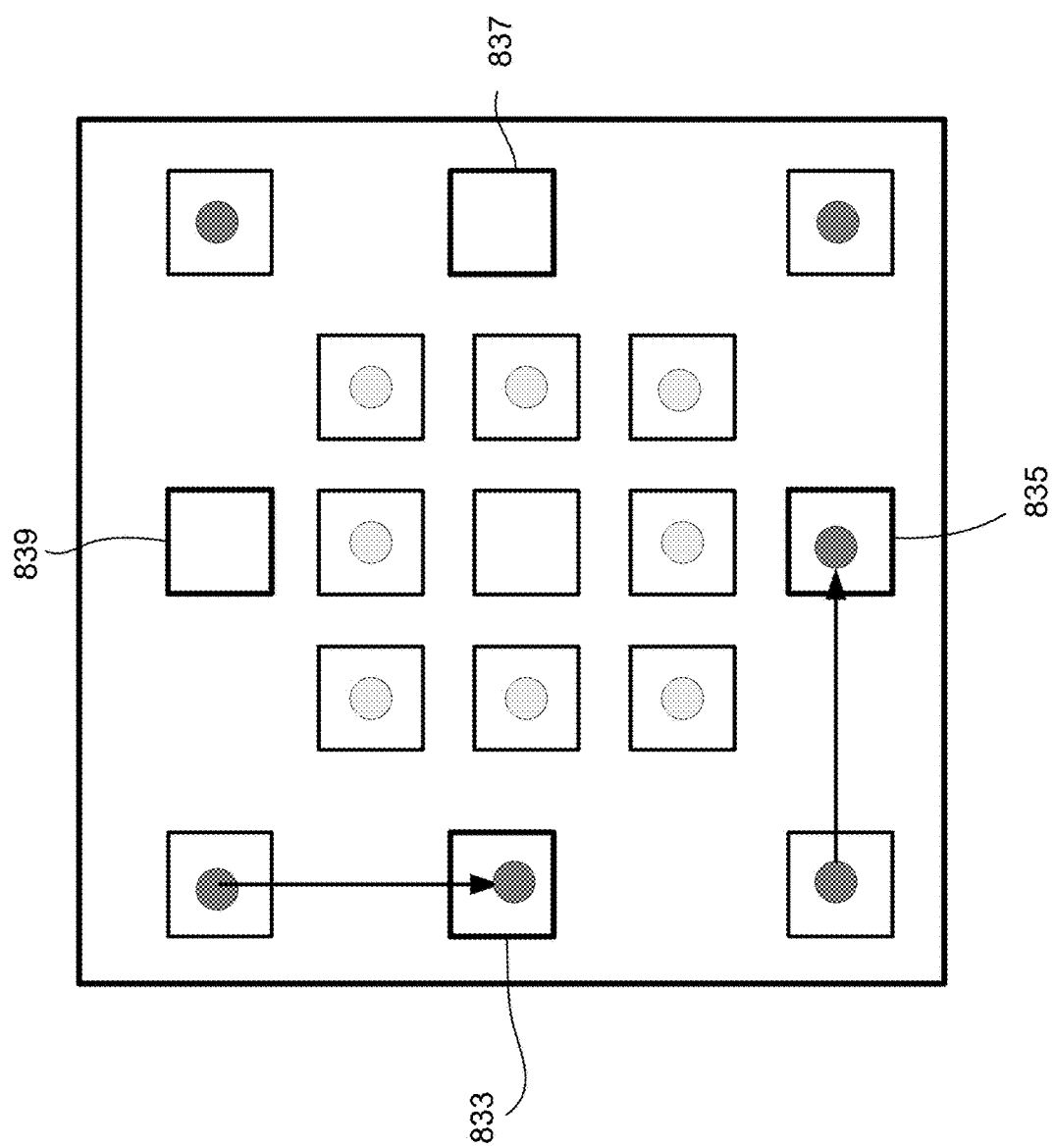

MULTI-AXIS MEMS MIRROR PARKING

CROSS-REFERENCE TO RELATED APPLICATIONS

The present application claims the benefit of the filing date of U.S. Provisional Patent Application No. 62/976,826 filed Feb. 14, 2020, the disclosure of which is hereby incorporated herein by reference.

BACKGROUND

Optical communications use modulated light beams to convey information through optical fibers, free space, or waveguides. A beam of light can be modulated either directly by modulating current to a light source, or externally by using an optical modulator to modulate a continuous-wave light beam produced by the light source. External modulation has advantages in that it can handle higher power and frequencies; however, the required components can be larger, more complex, and more expensive.

An optical circuit switch (OCS) is an all-optical, 3D switching matrix that can direct light from any input fiber N to any output fiber M by changing the angles of the mirrors in one or more micro-electromechanical system (MEMS) mirror arrays. The switch is designed for low insertion loss over a broad wavelength range, so each fiber can carry many wavelengths. The OCS is also designed for fast, reliable switching by the MEMS mirror arrays. Optical performance requirements include insertion loss, return loss, dynamic optical crosstalk, and static optical crosstalk.

SUMMARY

The present disclosure provides multiple safety measures that help protect against single high voltage channel failures in the driver. At least two separate voltages are applied to each MEMS mirror to move and "park" the mirror out of a camera sensor field of view in a servo system. For example, a 2-axis MEMS mirror having a 4-axis driver configuration may have a separate voltage driver channel to move the MEMS mirror in each of a positive X direction, negative X direction, positive Y direction, and negative Y direction. In this example, a first voltage may be applied in a positive X direction and a second voltage may be applied in a positive Y direction. This will then move the mirror in a diagonal direction. In the event one of the voltage driver channels fail, the mirror will still be "parked." Using at least two voltages, every mirror will have 4 possible parking positions defined: $X_{POS}, Y_{POS}$; $X_{POS}, Y_{NEG}$; $X_{NEG}, Y_{NEG}$; and $X_{NEG}, Y_{POS}$. In the event of a voltage channel failure, the servo system can park a mirror affected by the failure in an opposite corner. While the foregoing example described a 4-axis driver channel configuration, it should be understood that the multi-axis parking may be implemented in systems with different configurations as well, such as a 3-axis driver configuration.

One aspect of the disclosure provides a method for configuring an OCS, wherein the method include selecting a MEMS mirror of a plurality of MEMS mirrors in the OCS, each of the plurality of MEMS mirrors having at least two axes for rotation, wherein the selected MEMS mirror is not needed for switching, applying first voltage to a first axis of the selected MEMS mirror to move the selected MEMS mirror in a first direction, and applying a second voltage to a second axis of the selected MEMS mirror to move the selected MEMS mirror in a second direction, wherein the movements in the first direction and the second direction causes the selected MEMS mirror to be parked.

Another aspect of the disclosure provides optical communication system, including a plurality of MEMS mirrors configured to receive a beam of light and redirect it, a voltage supply, and one or more processors in communication with the plurality of MEMS mirrors and the voltage supply. The one or more processors are configured to apply first voltage to a first axis of a selected MEMS mirror of the plurality of MEMS mirrors to move the selected MEMS mirror in a first direction, and apply a second voltage to a second axis of the selected MEMS mirror to move the selected MEMS mirror in a second direction, wherein the movements in the first direction and the second direction causes the selected MEMS mirror to be parked.

Yet another aspect of the disclosure provides a non-transitory computer-readable medium storing instructions executable by one or more processors for performing a method of parking a selected MEMS mirror in a plurality of MEMS mirrors. The method includes applying first voltage to a first axis of the selected MEMS mirror to move the selected MEMS mirror in a first direction, and applying a second voltage to a second axis of the selected MEMS mirror to move the selected MEMS mirror in a second direction, wherein the movements in the first direction and the second direction causes the selected MEMS mirror to be parked.

In each of the aspects set forth above, the first and second voltage may be applied at substantially a same time or at different times.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings:

FIG. 10B illustrates an example rotation of the MEMS mirror including checking positions according to aspects of the disclosure.

DETAILED DESCRIPTION

This disclosure generally relates to multiple-axis parking of MEMS mirrors. MEMS mirrors in an array that are not intended for use in optical switching are selected to be parked. A first voltage is applied to a first axis of the selected MEMS mirror, causing the selected MEMS mirror to move in a first direction. A second voltage is applied to a second axis of the selected MEMS mirror, causing the mirror to move in a second direction. Just as one example, the first direction may be a positive or negative X direction, and the second direction may be a positive or negative Y direction. In this regard, the selected MEMS mirror is moved diagonally out of a camera field of view. If one of the first or second applied voltages fails, causing the selected MEMS mirror to drift back towards its original position along the first or second axes, the selected MEMS mirror will remain outside of the camera field of view.

According to some examples, parking plates may define boundaries for where the selected MEMS mirror should reside in its parked position. In some examples, the parking plate may be a region defined outside the camera field of view. In other examples, the parking plate may be a region defined within an enlarged camera field of view that is outside regions of interest for unparked MEMS mirrors. In either example, the parking plate may be a region with a parking baffle to help with stray light and sensor saturation. One or more processors may detect when the selected MEMS mirror drifts outside of the parking plate, indicating a failure of one of the first or second applied voltages. Accordingly, the one or more processors may take a responsive action, such as providing a notification to an operator, adjusting the failed voltage, etc.

The disclosure further provides for periodically rotating parked MEMS mirrors among various parking positions. In this regard, voltage channels for the first and second applied voltages are periodically tested to determine whether there is a failure. For example, if the selected MEMS mirror moves from a first parked position to an adjacent second parked position, but does not reach the parking plate defined for the adjacent second parked position, it may be detected that a failure is present. Similarly, the selected MEMS mirror may be tested as it rotates to third and fourth positions. In some examples, the edge parking regions may be defined, such as at vertical or horizontal positions. In such examples, the edge parking regions may be used to check each mirror as it is exercised.

Figure 1:
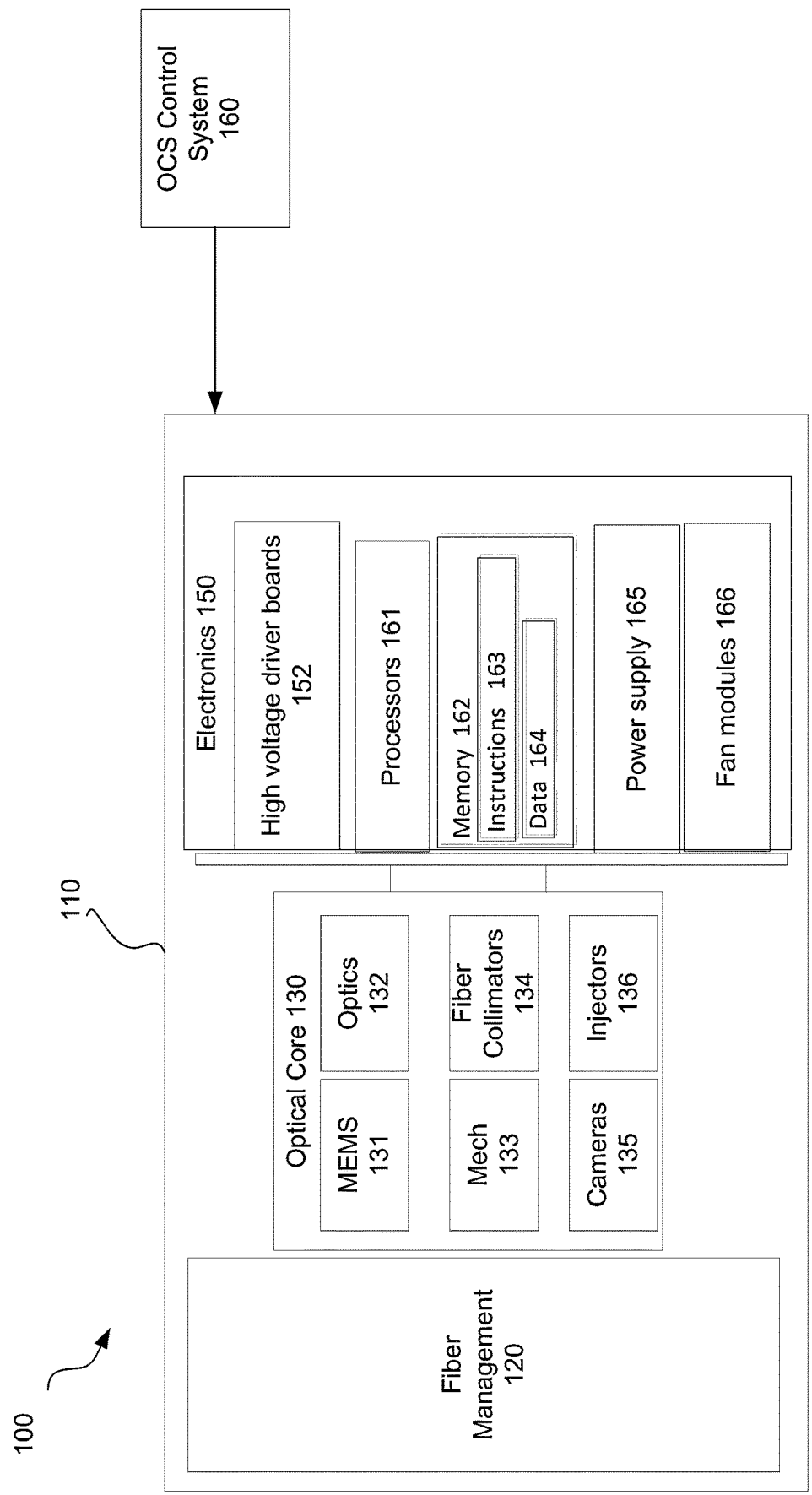
FIG. 1 is a block diagram illustrating an OCS according to aspects of the disclosure.

FIG. 1 illustrates an example OCS 100, such as may be used in datacenter. The OCS 100 includes a structure such as chassis 110 supporting a number of components. In a front of the OCS chassis 110 are optical fiber connections, such as fiber management block 120. The OCS 100 may further include, such as in a middle, an optical core 130. The optical core houses MEMS 131, fiber collimators 134, optics 132, cameras 135, and injectors 136 and other mechanisms 133. A rear of the OCS 100 includes electronics 150, such as high voltage driver boards 152 for the MEMS, one or more processors 161, such as a CPU board, one or more memories 162 storing executable software, and power supplies 165 and fan modules 166. The chassis 110 interfaces with OCS control system 160. While a number of components are shown, it should be understood that such components are merely non-limiting examples, and that other components may additionally or alternatively be included.

There may be any number of input fibers and output fibers connected to the front of the OCS chassis 110. Inside the chassis 110, these fiber fanouts are spliced to the fiber collimators 134.

The fiber collimators 134 are lensed fiber arrays. Just as one example, the fiber collimators 134 may include tens or hundreds or more fiber arrays. The fibers are assembled in a hole array that matches a MEMS array grid pattern, thereby forming a fiber array. The hole array may be made of silicon or other materials. The fiber array is attached to a mounting flange. A lens array is aligned and attached to the fiber array. Fiber and lens position errors are very tightly controlled.

The one or more processors 161 may be any conventional processors, such as commercially available microprocessors. Alternatively, the one or more processors may be a dedicated device such as an application specific integrated circuit (ASIC) or other hardware-based processor. Although FIG. 1 functionally illustrates the processor, memory, and other elements of the OCS control system 160 as being within the same respective blocks, it will be understood by those of ordinary skill in the art that the processor or memory may actually include multiple processors or memories that may or may not be stored within the same physical housing. Similarly, the memory may be a hard drive or other storage media located in a housing different from that of the OCS control system 160. Accordingly, references to a processor or computing device will be understood to include references to a collection of processors or computing devices or memories that may or may not operate in parallel.

Memory 162 may store information that is accessible by the processors 161, including instructions 163 that may be executed by the processors 161, and data 164. The memory 162 may be of a type of memory operative to store information accessible by the processors 161, including a non-transitory computer-readable medium, or other medium that stores data that may be read with the aid of an electronic device, such as a hard-drive, memory card, read-only memory ("ROM"), random access memory ("RAM"), optical disks, as well as other write-capable and read-only memories. The subject matter disclosed herein may include different combinations of the foregoing, whereby different portions of the instructions 163 and data 164 are stored on different types of media.

Data 164 may be retrieved, stored or modified by processors 161 in accordance with the instructions 163. For instance, although the present disclosure is not limited by a particular data structure, the data 164 may be stored in computer registers, in a relational database as a table having a plurality of different fields and records, XML documents, or flat files. The data 164 may also be formatted in a computer-readable format such as, but not limited to, binary values, ASCII or Unicode. By further way of example only, the data 164 may be stored as bitmaps comprised of pixels that are stored in compressed or uncompressed, or various image formats (e.g., JPEG), vector-based formats (e.g., SVG) or computer instructions for drawing graphics. Moreover, the data 164 may comprise information sufficient to identify the relevant information, such as numbers, descriptive text, proprietary codes, pointers, references to data stored in other memories (including other network locations) or information that is used by a function to calculate the relevant data.

The instructions 163 may be executed to selectively activate or deactivate particular pixel modulators within an injector of the optical circuit switch. Such activation or deactivation may effect the blocking or transmission of individual beams of light through the injector. It should be understood that the optical circuit switch 900 may include other components which are not shown but may be utilized in execution of the instructions 163.

Figure 2:
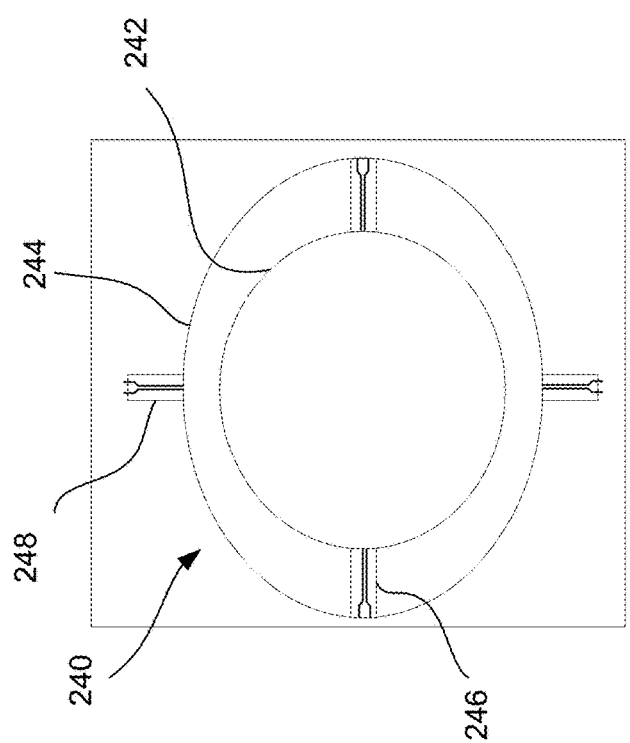
FIG. 2 is an example MEMS mirror according to aspects of the disclosure.

FIG. 2 illustrates an example MEMS mirror 240. The MEMS mirror 240 may vary in size, for example depending on implementation. By way of example only, the MEMS mirror 240 may be between approximately several hundred microns and several hundred millimeters. The MEMS mirror 240 may be highly reflective. For example, the MEMS mirror 240 may be coated with a highly reflective material, such as gold or other material. The mirror 240 includes an inner portion 242 and an outer portion 244, wherein the inner portion is rotatable about a first axis and the outer portion is rotatable about a second axis. For example, the inner portion may rotate about inner torsion beams 246 actuated by a comb drive actuator. The outer portion may rotate about outer torsion beams 248 actuated by a comb drive actuator. The comb drive actuators may be high voltage, electro-static vertical comb drives which rotate the mirrors about the torsion beams. For example, the rotation may be approximately +/−1-10 degrees when a voltage ranging between 10s of volts to hundreds of volts is applied across the electrodes.

Figure 3:
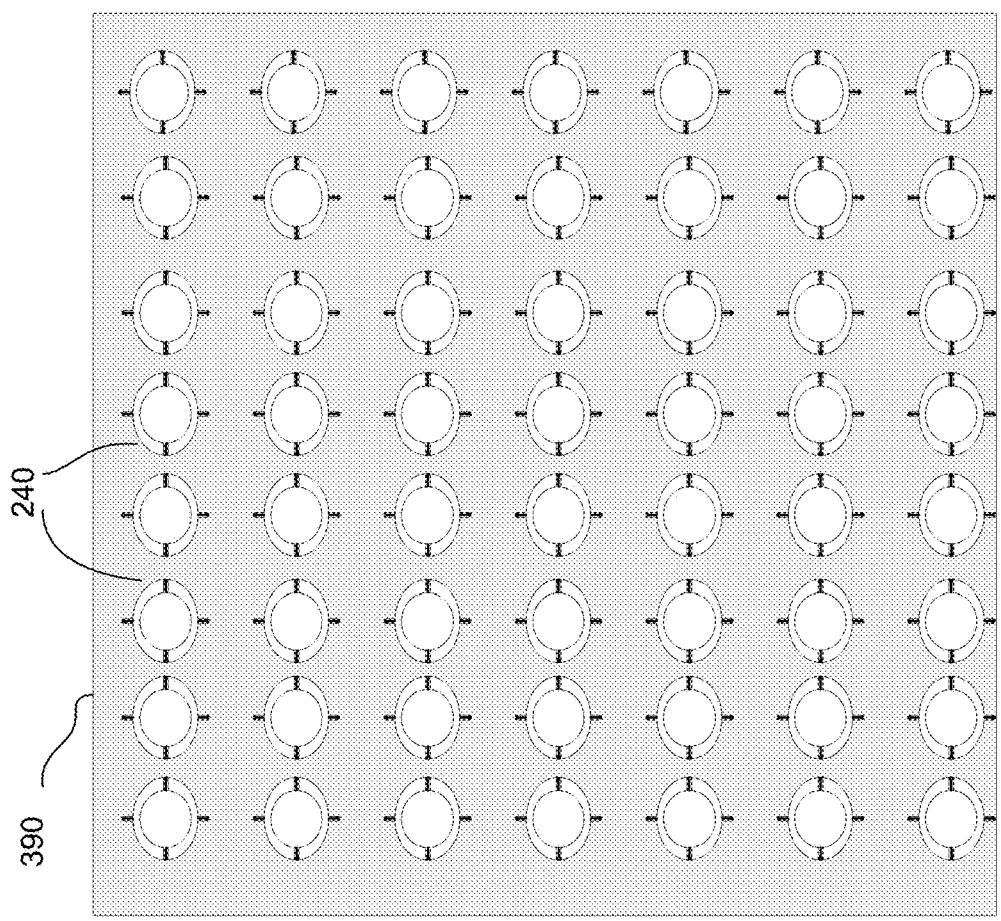
FIG. 3 is an example die including an array of MEMS mirrors according to aspects of the disclosure.

FIG. 3 illustrates an example die including an array of MEMS mirrors 240. Accordingly to some example, the MEMS die packages include MEMS mirror arrays, but in other examples any number of MEMS mirrors may be included. The die may be hermetically sealed inside a package with a window in its lid. Not all of the mirrors may be needed or used at a same time. For example, only the best mirrors and fibers in a MEMS mirror array may be selected to make an optical switch, which may be divided as a number of ports + several spares.

Figure 4:
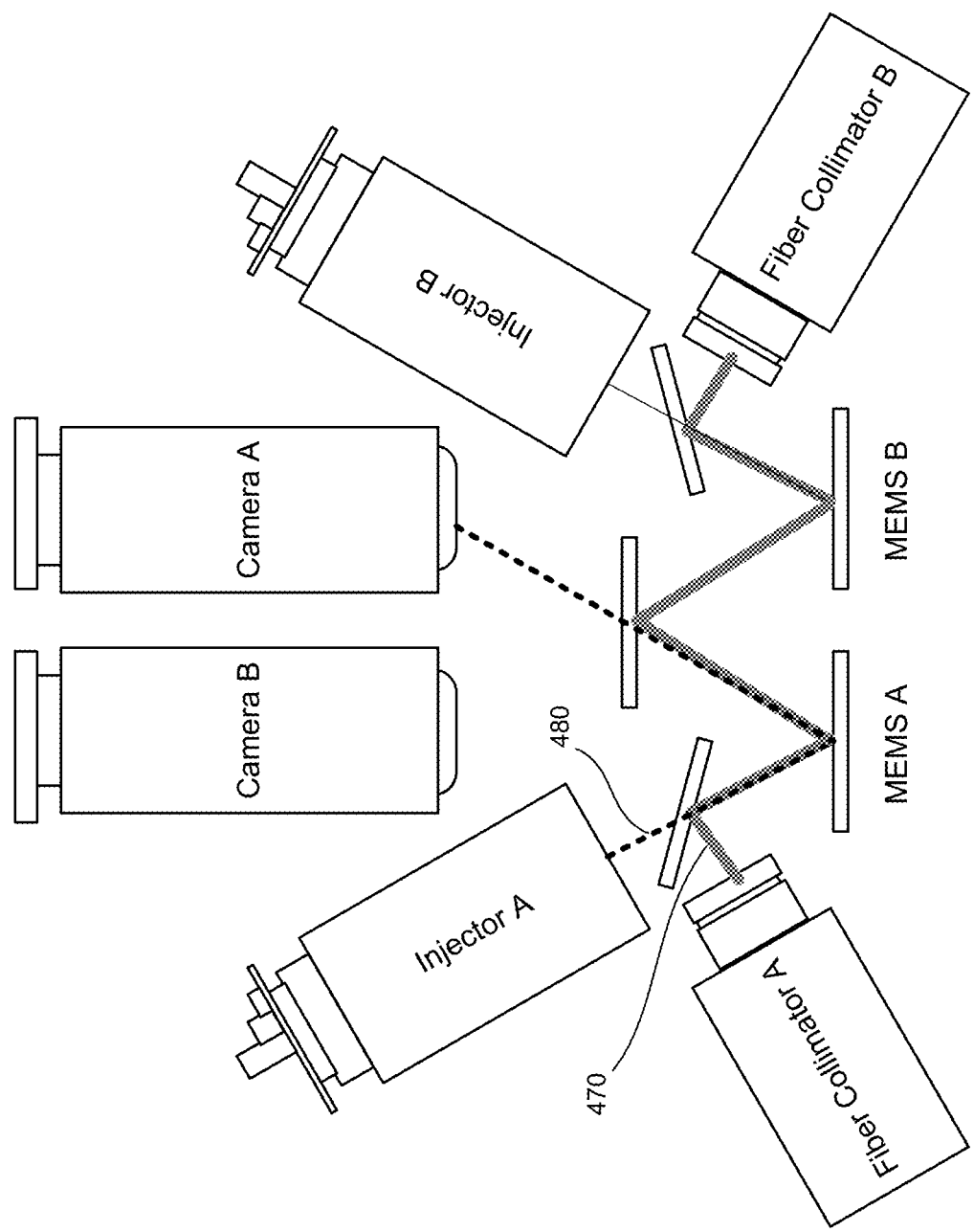
FIG. 4 is an example data path and optical path of the optical core according to aspects of the disclosure.

FIG. 4 provides an examples of a data optical path and a monitor optical path included in the optical core. On data path 470, traffic comes in as light input to fiber collimator A. All of the optics in the data path 470 may be designed for very low loss over a variety of wavelengths. The light travels along this path 470, and is reflected from MEMSA, then from MEMSB, then is coupled to output fiber collimator B. MEMS A and MEMS B may be just two MEMS mirrors of a larger array, such as illustrated in FIG. 3 and explained above. By rotating the mirrors in the array, light from any input fiber can be coupled to any output fiber. The injectors shine small laser beams on the MEMS. The cameras image the beams reflected from the MEMS to measure the mirror positions.

Monitor path 480 does not carry data, but provides information to a mirror control system about the positions of the mirrors. This may be done using, for example, an injector to shine small beams on each of the MEMS mirrors, and a camera to view the positions of the beams reflected from the MEMS. There may be a camera/injector pair for each MEMS.

Figure 5:
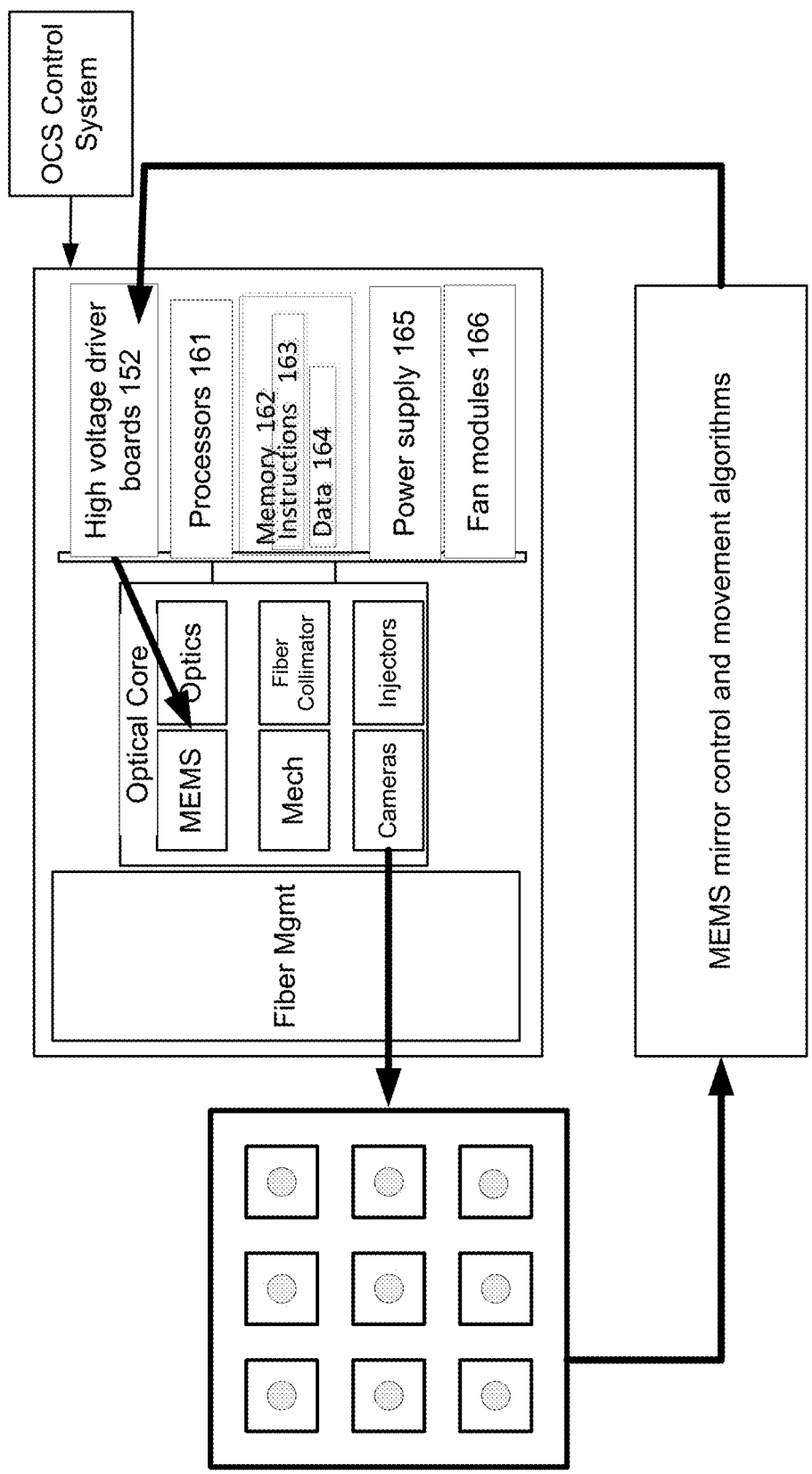
FIG. 5 is an example mirror control loop according to aspects of the disclosure.

FIG. 5 illustrates an example mirror control loop. The OCS control system 160 tells the OCS what configuration it should be in. The mirror control loop handles the MEMS mirror control and movement algorithms based on the monitor path data, and then tells the high voltage drivers to move the mirrors.

Figure 6B:
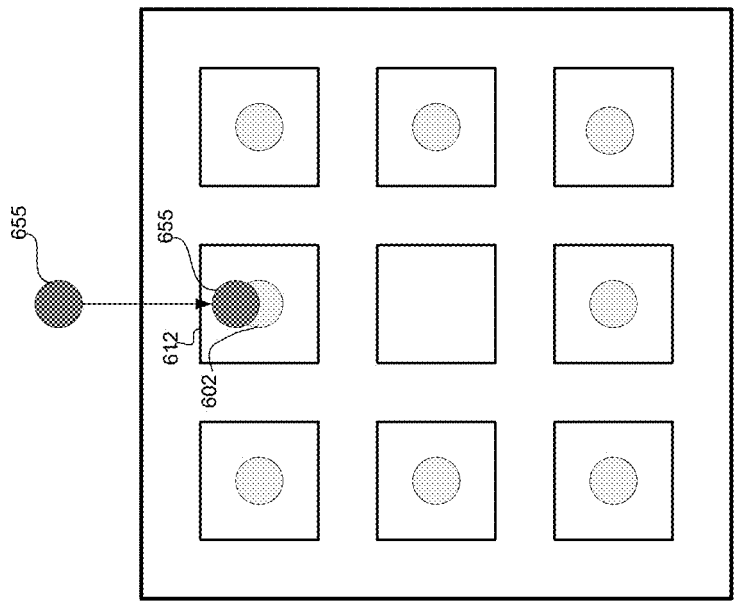
FIGS. 6A-B illustrate an example of single-axis parking of a MEMS mirror, and failure of the parked MEMS mirror, respectively.
Figure 6A:
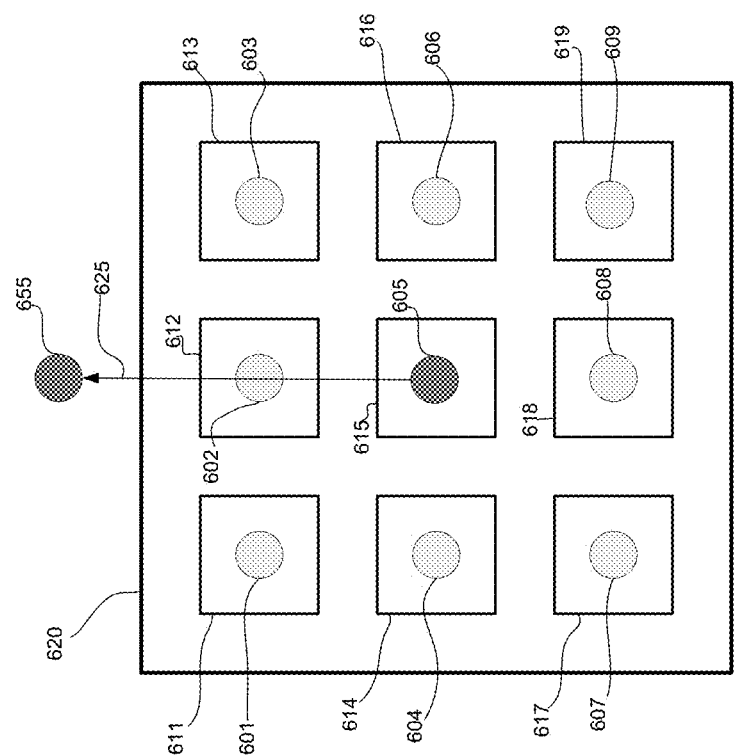

FIG. 6A illustrates an example of single-axis parking of a MEMS mirror. As shown, a camera field of view 620 includes a plurality of MEMS mirrors 601-609. Each MEMS mirror 601-609 has a corresponding region of interest 611-619. The region of interest 611-619 defines where each MEMS mirror 601-609 should be positioned for routing optical signals. While several regions of interest 611-619 for corresponding MEMS mirrors 601-609 are shown, it should be understood that the camera field of view 620 may actually include a large number of spots for MEMS mirrors and regions of interest, such as on the order of hundreds or more.

Not all of the MEMS mirrors 601-609 may be needed. Accordingly, MEMS mirrors 601-604 and 606-609 may be selected for routing optical signals, while the MEMS mirror 605 is selected to be parked outside of the camera field of view 620. Conventionally, such parking involved moving the MEMS mirror 605 in a single dimension, such that a corresponding camera monitoring spot 655 for the MEMS mirror 605 would be outside the camera field of view 620, as shown by arrow 625.

FIG. 6B illustrates a failure of the parked MEMS mirror 605. As a result of the failure, the camera monitoring spot 655 for the MEMS mirror 605 begins to drift back into the camera field of view 620. The camera monitoring spot 655 drifts into the region of interest 612 for the mirror 602 that was selected to route optical signals, thereby interfering with the mirror 602. This can cause signals to be misdirected and/or improperly routed.

Figure 7B:
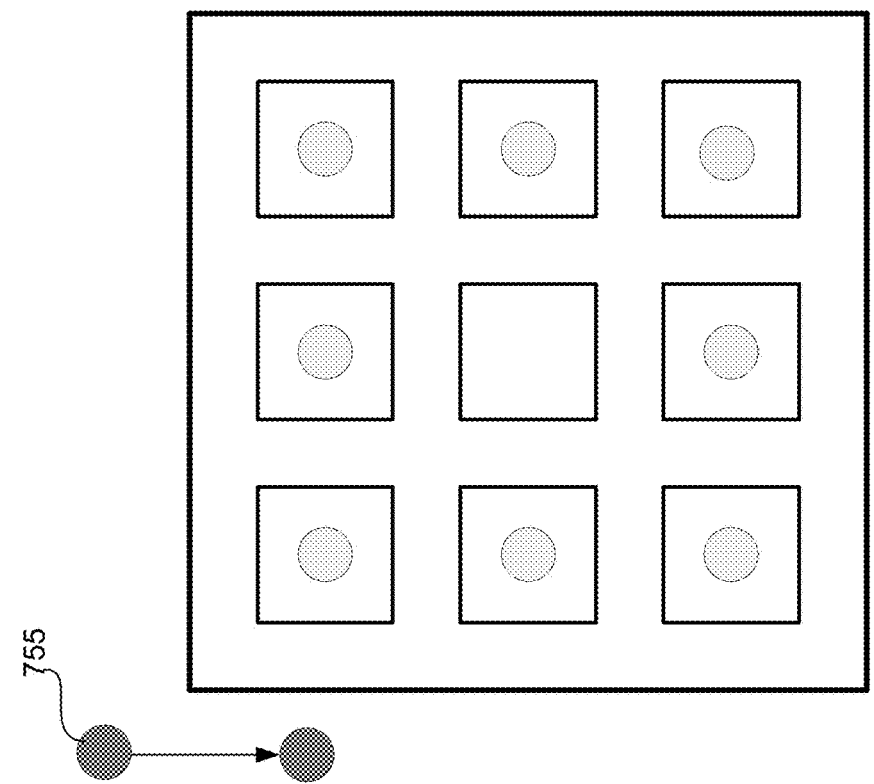
FIGS. 7A-B illustrate an example of multiple-axis parking of a MEMS mirror and failure, respectively, according to aspects of the disclosure.
Figure 7A:
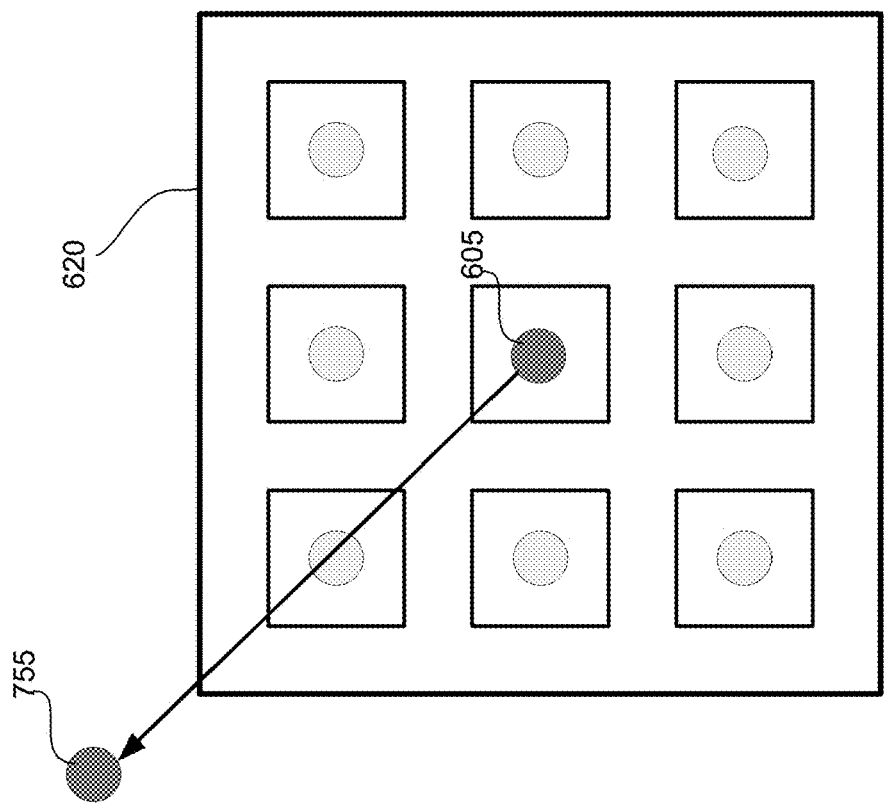

FIG. 7A illustrates an example of multiple-axis parking of a MEMS mirror. According to this example, a plurality of voltages are applied to the MEMS mirror, each voltage causing movement in a different direction. For example, the voltages may be applied to various axes of the MEMS mirror, where a first voltage applied to a first axis causes movement in a first direction and a second voltage applied to a second axis causes movement in a second direction. In the example shown, the voltages are applied to park the MEMS mirror 605 in a Y positive direction and an X negative direction, thereby causing camera monitoring spot 755 for the MEMS mirror 605 to move diagonally outside the camera field of view 620. It should be understood, however, that various other multi-axis positions are possible. For example, the MEMS mirror 605 may be parked in any of the Y negative, X negative; Y negative, X positive; or Y positive, X positive directions.

While only one parked MEMS mirror 605 is shown in Figure, it should be understood that multiple MEMS mirrors of an array may be parked at a given time. For example, different MEMS mirrors may be parked in different X,Y positions. In some examples, multiple MEMS mirrors may be parked in the same X,Y position, such that the camera monitoring spots for such multiple MEMS mirrors overlaps.

FIG. 7B illustrates an example failure of a voltage driver channel. If a failure of one of the voltage driver channels applied to the MEMS mirror 605 fails, the camera monitoring spot 755 for the MEMS mirror 605 may shift out of its X, Y position. However, as long as one of the multiple voltage channels is properly functioning, the camera monitoring spot 755 will remain outside the camera field of view 620 despite any shift. For example, if the Y positive voltage fails, the camera monitoring spot 755 may begin to shift downwards as shown. However, because the X negative voltage is still properly functioning, the camera monitoring spot 755 will remain outside a left side of the camera field of view 620 despite the failure of the Y positive voltage channel.

According to some examples, each parked MEMS minor 605 may have a backup parking position. For example, a controller may be programmed with a default parking position and a backup parking position for the MEMS mirror 605. For the default parking position, the controller may be programmed to apply first and second voltages to first and second voltage channel drivers to effect movement of the MEMS mirror to the default parking position, such as Y positive X negative. For the backup parking position, the controller may be programmed to park the MEMS mirror 605 in an opposite parking position, such as the Y negative X positive position. This may be done by, for example, applying different first and second voltages to the first and second voltage drivers. In this regard, if there is a failure of either voltage channel driver, the MEMS mirror 605 can be moved to the backup parking position where it should not be affected by the failure.

Figure 8:
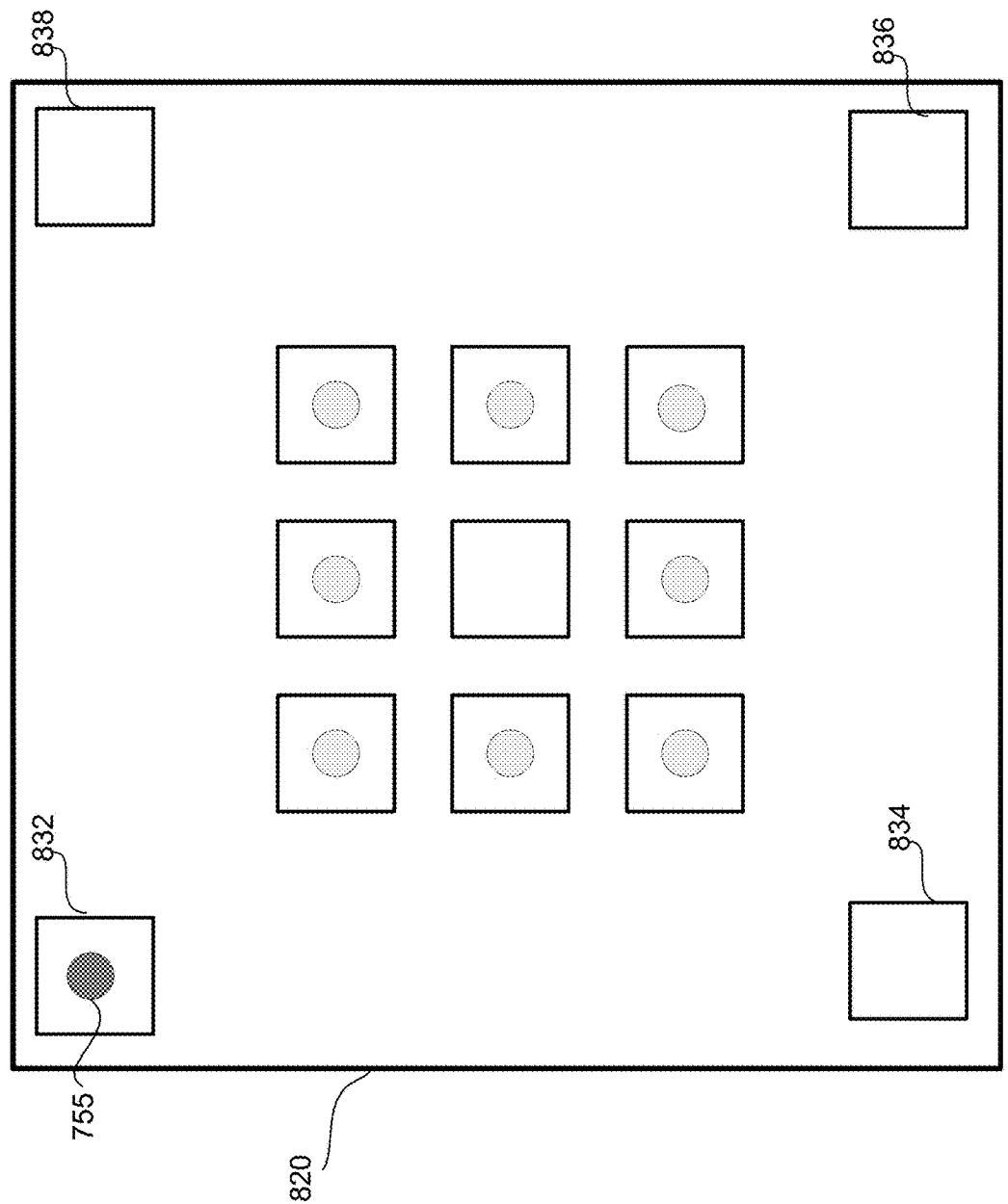
FIG. 8 illustrates an example of parking plates defined for various multi-axis parking positions according to aspects of the disclosure.

According to some examples, parking plates may define parking positions for the parked MEMS mirrors. FIG. 8 provides an example of parking plates 832, 834, 836, 838. In this example, each parking plate is positioned at a corner outside the regions of interest for the MEMS mirrors. For example, parking plate 832 corresponds to the Y positive, X negative position; parking plate 834 corresponds to the Y negative, X negative position; parking plate 836 corresponds to the Y negative, X positive position; and parking plate 838 corresponds to the Y positive, X positive position. According to some examples, camera field of view 820 may be enlarged so as to include the parking positions. In this regard, the camera can detect movement of the camera monitoring spot if it strays from the parked position.

Each parking plate 832-838 may be, for example, a mechanical light baffle or other mechanism that would render the parking positions non-visible. For example, the mechanical light baffle may be processed or treated to be optically non-reflective. As such, when the MEMS mirror 605 is parked, such that the camera monitoring spot 755 is in the Y positive X negative position, for example, the camera monitoring spot 755 would be blocked by the parking plate 832. While a slight drop in the camera monitoring spot 755 may not be detected, as the parking plate 832 would still be blocking, more significant drops would move the camera monitoring spot 755 outside the bounds of the parking plate 832. Such movement would be detected by the camera, thereby providing an indication that one of the voltage channel drivers used to apply the voltage to the MEMS mirror 605 has failed.

Figure 9:
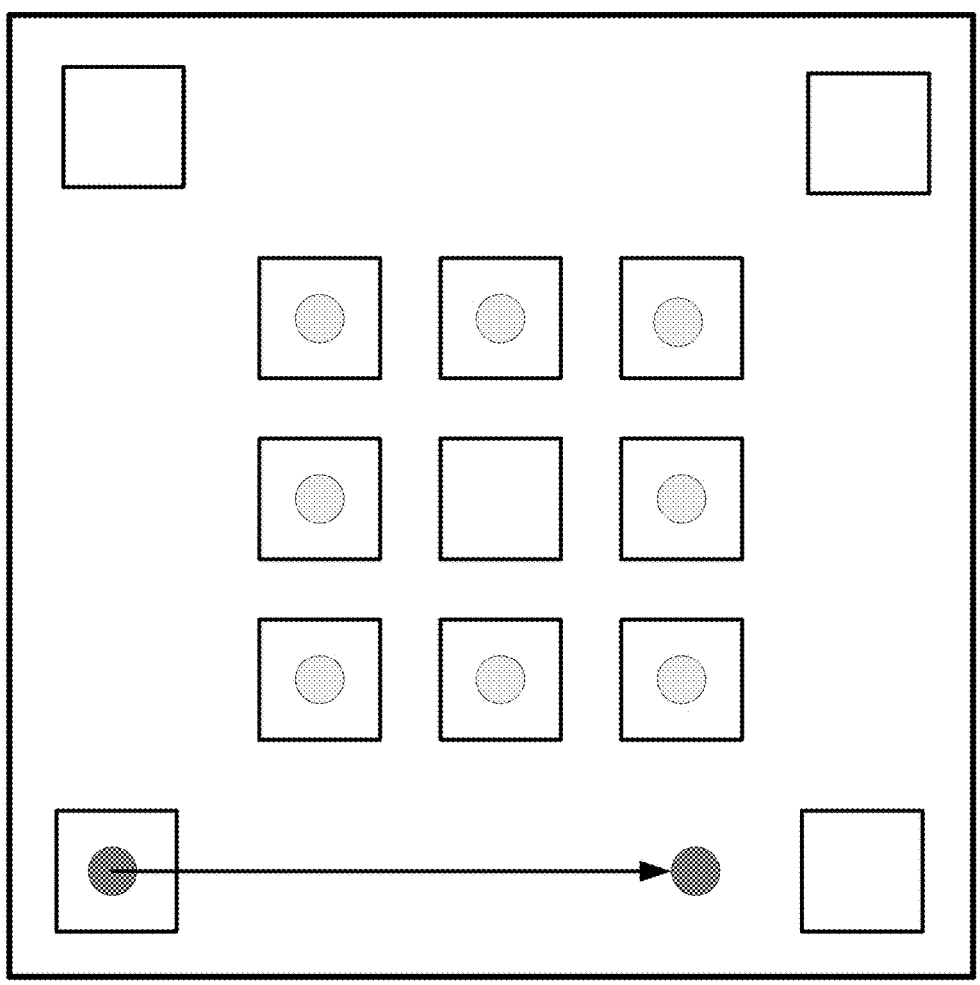
FIG. 9 illustrates an example movement of a MEMS mirror from a first parked position to a second parked position, according to aspects of the disclosure.

FIG. 9 illustrates an example movement of a MEMS mirror from a first parked position to a second parked position. For example, the parking positions may be "floating" in that the parking position for the parked MEMS mirrors will periodically change. For example, as shown, the parking spot for the MEMS mirror 605 may be changed such that the camera monitoring spot 755 moves from a first parking spot behind parking plate 832 to a second parking spot behind parking plate 834. As shown in this example, the camera monitoring spot 755 never fully reaches the second parking spot. Accordingly, the camera may detect this failure to reach the second parking spot and determine that there is a failure of the voltage channel driver for the Y negative position. In this regard, rather than waiting for a failure to occur, the failure may be detected at the time of movement, which may be scheduled in advance. For example, the time of movement may be scheduled for a time when the MEMS mirrors are generally in lower demand. For an optical circuit switch, for example, this may be during a time when an amount of traffic to be routed by the switch is predicted to be relatively low as compared to other times. In addition, the failure may be detected and addressed immediately, rather than waiting for scheduled assessments by the camera.

According to some examples, when a voltage channel failure is known, parking positions utilizing such voltages channels may be avoided. For example, such parking positions utilizing the known failed channel can be added to a predetermined list, wherein one or more processors programmed to control the parking of the MEMS mirrors are programmed to avoid using parking positions on the list.

Figure 10A:
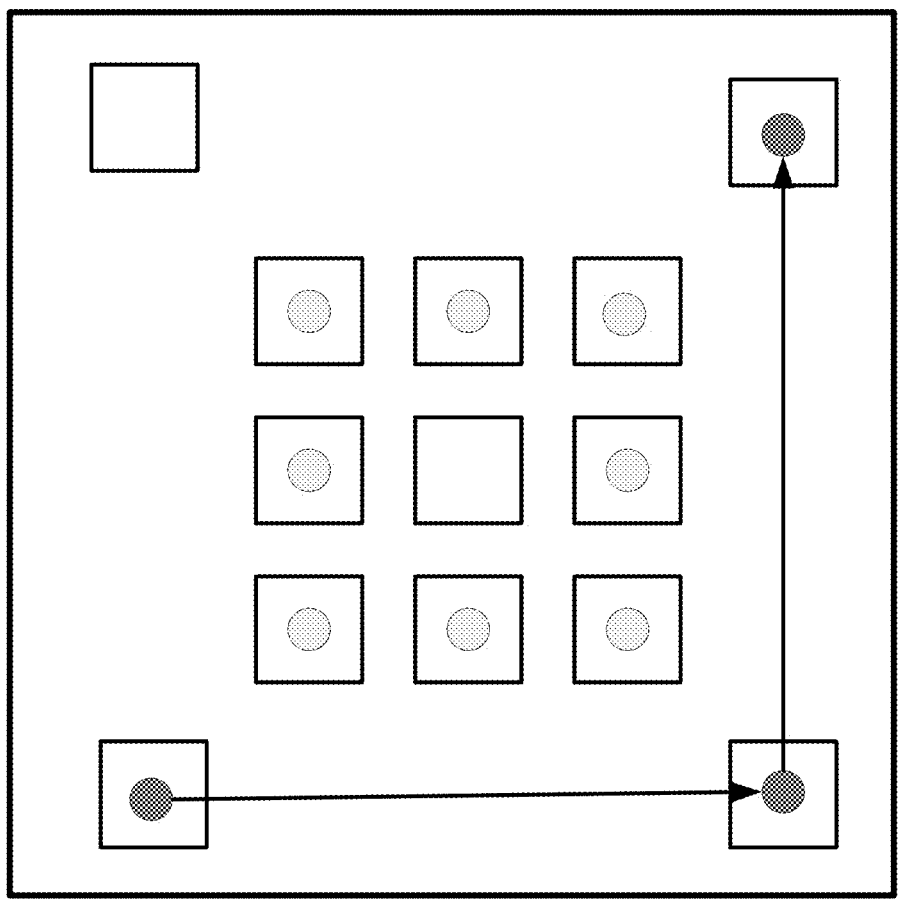
FIG. 10A illustrates an example rotation of the MEMS mirror among various parked positions according to aspects of the disclosure.

FIG. 10A illustrates an example rotation of the MEMS mirror among various parked positions. For example, further to the movement between parking positions as discussed above in connection with FIG. 9, parking spots for one or more of the parked MEMS mirrors may be periodically moved. For example, the parking spot for a given MEMS mirror may be rotated from the first parking plate 832 to the second parking plate 834 to the third parking plate 836, etc. As such, the voltage channel drives used to park the MEMS mirrors are periodically tested.

A frequency with which the MEMS mirrors are rotated among parking spots may be predetermined. For example, the frequency may be programmed based on a particular application for which the MEMS mirrors are used. The frequency may be, by way of example only, on the order of minutes, hours, or days. For an optical circuit switch, for example, the parked MEMS mirrors may rotate parking positions once or twice a day. The rotation may be programmed such that it occurs automatically. Further, responsive actions to detection of failure may also be automated. For example, when a failure is detected, the affected MEMS mirror may automatically be moved from a default position to a backup position, as discussed above.

FIG. 10B illustrates another example rotation of the MEMS mirrors among parked positions, including edge positions 833, 835, 837, 839. For example, where there are already a large number of parked mirrors in a given position, such as in corner parking spots 832, 834, 836, 838 or other positions, it is possible that a target parking spot already has other mirror centroids present. If this is the case, it can be difficult to detect that the centroid is within the region of interest. Instead, secondary regions of interest at edge positions 833, 835, 837, 839 can be used as health check regions. Mirrors that are being parked or cycled around the parking spots 832, 834, 836, 838 will be moved into these boxes of the edge positions 833, 835, 837, 839 and then both axes can be checked to ensure proper functioning. For example, each edge position 833, 835, 837, 839 can be used to test a different drive channel.

In addition to the operations described above and illustrated in the figures, various operations will now be described. It should be understood that the following operations do not have to be performed in the precise order described below. Rather, various operations can be handled in a different order or simultaneously, and operations may also be added or omitted.

Figure 11:
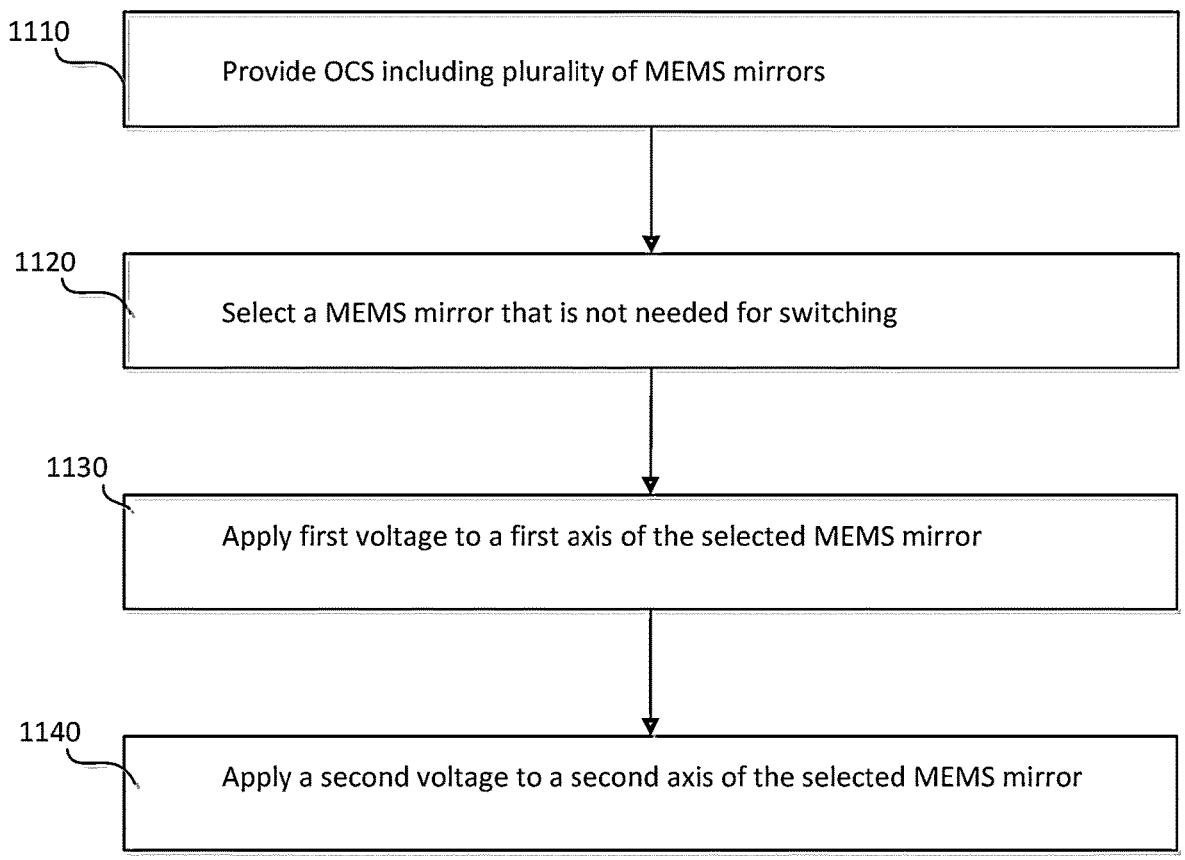
FIG. 11 is a flow diagram illustrating an example method of parking the MEMS mirror according to aspects of the disclosure.

FIG. 11 illustrates an example method 1100 of parking a MEMS mirror. In block 1110, an OCS is provided, the OCS including a plurality of MEMS mirrors. For example, the MEMS mirrors may be in an array, such as an array of tens, hundreds, thousands, or more MEMS mirrors. Some mirrors of the array may not be needed, however. For example, the OCS may have fewer inputs and outputs, and need fewer MEMS mirrors for routing optical signals.

In block 1120, a MEMS mirror that is not needed is selecting. For example, the selected MEMS mirror in the OCS may not be needed for switching. The selected mirror may be, for example, one that is in some way inferior to other MEMS mirrors in the array. For example, the selected MEMS mirror may have a less preferable position, a defective component, less precision, etc. Accordingly, the selected MEMS mirror will be parked.

In block 1130, a first voltage is applied to a first axis of the selected MEMS mirror to move the selected MEMS mirror in a first direction. For example, the first voltage may be applied to a voltage channel driver coupled to the first axis for rotating the MEMS mirror about the first axis. Such movement causes a camera monitoring spot for the selected MEMS mirror to move outside a camera field of view in a first dimension.

In block 1140, a second voltage is applied to a second axis of the selected MEMS mirror to move the selected MEMS mirror in a second direction. For example, the second voltage may be applied to a second voltage channel driver coupled to the second axis for rotating the MEMS mirror about the second axis. Such movement causes the camera monitoring spot for the selected MEMS mirror to move in a second dimension, remaining outside the camera field of view. Accordingly, the first and second movements taken together may cause the camera monitoring spot to move in a direction diagonal from its original spot. The first and second voltages may be applied at substantially a same time or at different times. The mechanical response to application of the first voltage may be different than the mechanical response to application of the second voltage. For example, the movement about the first axis may be different, such as different in timing, degree, etc., than the movement about the second axis.

While the foregoing method 1100 describes parking the MEMS mirror of an OCS, it should be understood that the first and second voltages may similarly be applied in other types of systems including MEMS array to park selected MEMS mirrors.

Figure 12:
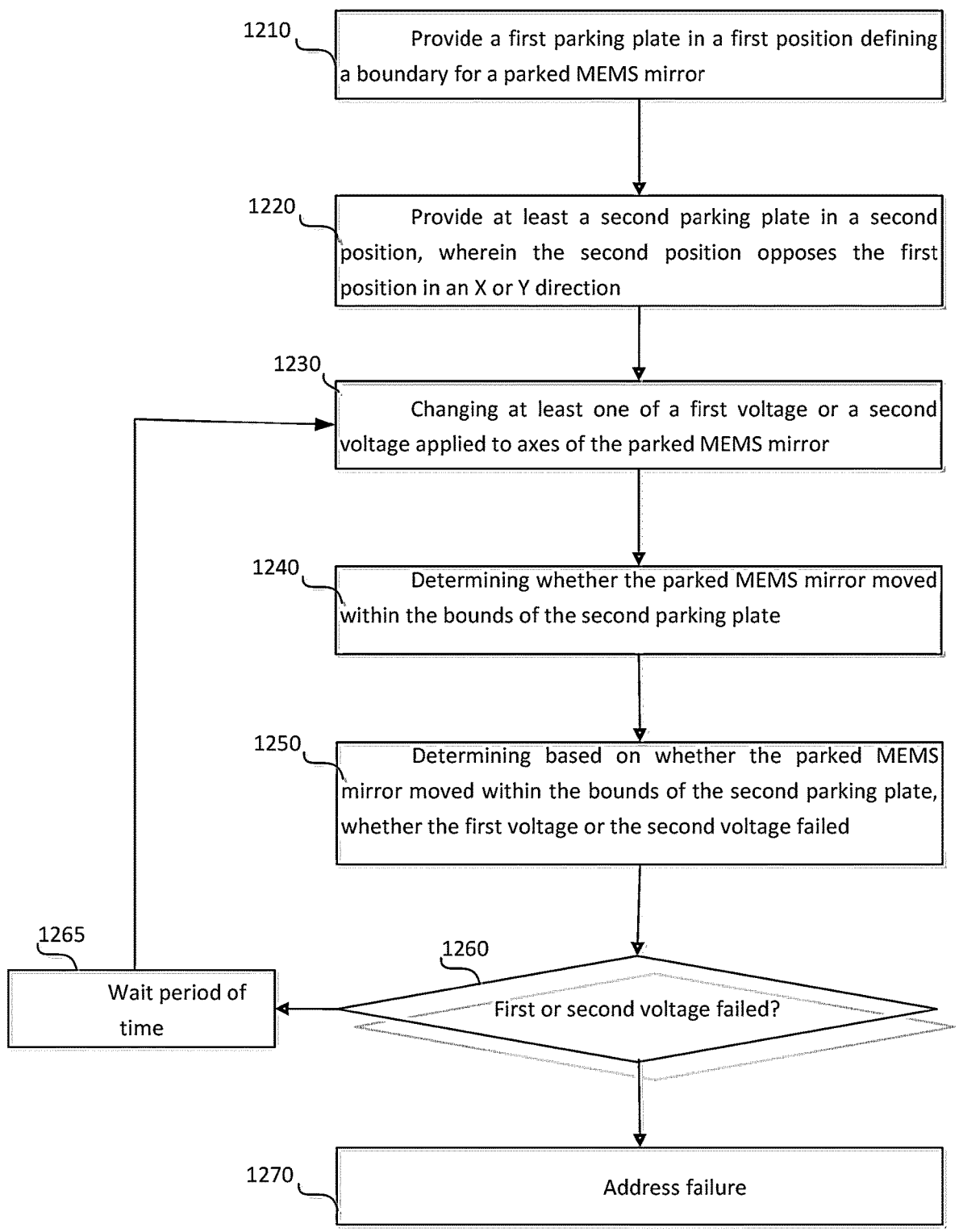
FIG. 12 is a flow diagram illustrating an example method of detecting failures for the parked MEMS mirror according to aspects of the disclosure.

FIG. 12 illustrates an example method 1200 of detecting failures for the parked MEMS mirror. In block 1210, a first parking plate is provided in a first parking position that defines a boundary for the parked MEMS mirror. In block 1220, at least a second parking plate is provided in a second position, which opposes the first position in at least an X or Y direction. While two parking plates are described in this example method, it should be understood that additional parking plates may also be provided. For example, each corner outside regions of interest of the non-selected MEMS mirrors may include a parking plate.

In block 1230, a camera monitoring spot for the selected MEMS mirror is moved. For example, at least one of the first voltage or the second voltage applied to the first or second axes of the selected parked MEMS mirror may be changed.

In block 1240, it is determined whether the parked MEMS mirror moved within the boundary of the second parking plate. For example, the camera may determine whether it can see the camera monitoring spot of the parked MEMS mirror outside the second parking plate, or whether the parked MEMS mirror has completed transition to be fully blocked by the second parking plate.

In blocks 1250 and 1260, it is determined, based on the movement of the parked MEMS mirror, whether the first or second voltage channel driver has failed. For example, if the parked MEMS mirror does not complete transition to the second parking plate, it may be determined that at least one of the voltage channel drivers has failed.

If there is no failure in block 1260, the system may wait a period of time (block 1265) before changing the first and/or second voltage again. For example, the system may wait a few minutes, hours, days, etc. The interval of time that the system waits may be predetermined based on the type of system or application, such as whether the system is an OCS for switching optical signals or another type of system. In this regard, the selected parked MEMS mirrors may be moved periodically to continually check whether they are properly parked and the voltage channel drivers are properly functioning.

If there is a failure in block 1260, it may be addressed in block 1270. For example, the parked MEMS mirror may be moved to a backup parking position where it is not affected by the failure. In other examples, a notification may be sent to an operator to check the status of the selected MEMS mirror. Any of a number of various actions to address the failure are possible.

The foregoing systems and methods are advantageous in that they ensure parking of a MEMS mirror outside a camera field of view, even when the parking partially fails. In this regard, failure of the parked MEMS mirror will not interfere with other MEMS, etc.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A method for configuring an optical circuit switch (OCS), comprising:
   selecting a microelectromechanical system (MEMS) mirror of a plurality of MEMS mirrors in the OCS, each of the plurality of MEMS mirrors having at least two axes for rotation, wherein the selected MEMS mirror is not used for routing optical signals;
   applying first voltage to a first axis of the selected MEMS mirror to move the selected MEMS mirror in a first direction; and
   applying a second voltage to a second axis of the selected MEMS mirror to move the selected MEMS mirror in a second direction,
   wherein the movements in the first direction and the second direction causes the selected MEMS mirror to be parked outside a region of interest, wherein the region of interest is defined by locations of a plurality of non-selected MEMS mirrors.

2. The method of claim 1, further comprising detecting, with one or more processors, when at least one of the first voltage or the second voltage fails.

3. The method of claim 2, wherein the detecting comprises determining when a camera monitoring spot for the parked MEMS mirror moves.

4. The method of claim 3, wherein a field of view for the camera includes the region of interest and a parking region for the selected MEMS mirrors.

5. The method of claim 4, further comprising providing a first parking plate defining a boundary of a first parking position for the selected MEMS mirror.

6. The method of claim 5, wherein the first parking plate is positioned in the parking region outside a corner of the region of interest.

7. The method of claim 5, further comprising detecting, by the camera, when the camera monitoring spot for the selected MEMS mirror moves outside the boundary of the first parking plate.

8. The method of claim 5, further comprising:
   changing at least one of the first voltage applied to the first axis or the second voltage applied to the second axis to change a parking position of the selected MEMS mirror from the first parking plate to a second parking plate; and
   determining whether the camera monitoring spot for the selected MEMS mirror completes transition between the first parking plate and the second parking plate.

9. The method of claim 8, further comprising periodically changing the parking position of the selected MEMS mirror according to a predefined schedule.

10. The method of claim 2, further comprising:
    defining a backup parking position for the selected MEMS mirror, the backup parking position defined in at least two dimensions; and
    moving, by one or more processors, the selected MEMS mirror to the backup parking position in response to detecting when at least one of the first voltage or the second voltage fails.

11. An optical communication system comprising:
    a plurality of microelectromechanical systems (MEMS) mirrors configured to receive a beam of light and redirect it;
    a voltage supply; and
    one or more processors in communication with the plurality of MEMS mirrors and the voltage supply, the one or more processors configured to:
    apply first voltage to a first axis of a selected MEMS mirror of the plurality of MEMS mirrors to move the selected MEMS mirror in a first direction, wherein the selected MEMS mirror is not used for routing optical signals; and
    apply a second voltage to a second axis of the selected MEMS mirror to move the selected MEMS mirror in a second direction,
    wherein the movements in the first direction and the second direction causes the selected MEMS mirror to be parked outside a region of interest, wherein the region of interest is defined by locations of a plurality of non-selected MEMS mirrors.

12. The system of claim 11, wherein the one or more processors are further configured to detect when at least one of the first voltage or the second voltage fails.

13. The system of claim 12, further comprising a camera configured to monitor the plurality of MEMS mirrors, wherein the detecting comprises determining when a camera monitoring spot for the parked MEMS mirror moves.

14. The system of claim 13, wherein a field of view for the camera includes the region of interest and a parking region for the selected MEMS mirrors.

15. The system of claim 14, further comprising a first parking plate defining a boundary of a first parking position for the selected MEMS mirror, wherein the first parking plate is positioned in the parking region outside a corner of the region of interest.

16. The system of claim 15, wherein the one or more processors are further configured to detect, using the camera, when the camera monitoring spot for the selected MEMS mirror moves outside the boundary of the first parking plate.

17. The system of claim 15, wherein the one or more processors are further configured to:
    change at least one of the first voltage applied to the first axis or the second voltage applied to the second axis to change a parking position of the selected MEMS mirror from the first parking plate to a second parking plate; and
    determine whether the camera monitoring spot for the selected MEMS mirror completes transition between the first parking plate and the second parking plate.

18. The system of claim 17, wherein the one or more processors are further configured to periodically change the parking position of the selected MEMS mirror according to a predefined schedule.

19. The system of claim 12, wherein the one or more processors are further configured to move the selected MEMS mirror to a backup parking position in response to detecting when at least one of the first voltage or the second voltage fails, the backup parking position defined in at least two dimensions.

20. A non-transitory computer-readable medium storing instructions executable by one or more processors for performing a method of parking a selected microelectromechanical system (MEMS) mirror in a plurality of MEMS mirrors, the method comprising:
    applying first voltage to a first axis of the selected MEMS mirror to move the selected MEMS mirror in a first direction, wherein the selected MEMS mirror is not used for routing optical signals; and
    applying a second voltage to a second axis of the selected MEMS mirror to move the selected MEMS mirror in a second direction,
    wherein the movements in the first direction and the second direction causes the selected MEMS mirror to be parked outside a region of interest, wherein the region of interest is defined by locations of a plurality of non-selected MEMS mirrors.

* * * * *